US011646659B2

(12) United States Patent
Guiraud

(10) Patent No.: US 11,646,659 B2
(45) Date of Patent: May 9, 2023

(54) SIGNAL PROCESSOR AND METHOD

(71) Applicant: SCALINX, Paris (FR)

(72) Inventor: Lionel Guiraud, Saint-Aubin-sur-Mer (FR)

(73) Assignee: SCALINX, Paris (FR)

(*) Notice: Subject to any disclaimer, the term of this patent is extended or adjusted under 35 U.S.C. 154(b) by 154 days.

(21) Appl. No.: 17/105,202

(22) Filed: Nov. 25, 2020

(65) Prior Publication Data

US 2021/0211045 A1     Jul. 8, 2021

(30) Foreign Application Priority Data

Jan. 6, 2020 (EP) .................................. 20290001

(51) Int. Cl.
  *H02M 3/15* (2006.01)
  *H02M 3/155* (2006.01)
  *H03K 5/24* (2006.01)
  *H03M 3/00* (2006.01)

(52) U.S. Cl.
  CPC ............. *H02M 3/155* (2013.01); *H03K 5/24* (2013.01); *H03M 3/30* (2013.01)

(58) Field of Classification Search
  CPC ........... H03F 1/34; H03F 3/45; H03F 3/45071
  USPC ................ 330/259, 260, 265, 270, 271, 282
  See application file for complete search history.

(56) References Cited

U.S. PATENT DOCUMENTS 5,642,078 A     6/1997   Navabi et al.
9,564,863 B1*   2/2017   Giridharan ............. H03G 3/007

2005/0116774 A1*   6/2005   Fanous ................ H03G 3/3036
                                                          330/124 R
2005/0218983 A1*  10/2005   Matsuda ............. H03F 3/45179
                                                          330/257
2013/0250631 A1    9/2013   Liao et al.
2013/0271226 A1   10/2013   Sinoussi
                          (Continued)

FOREIGN PATENT DOCUMENTS

EP          1797492 B1     2/2012

OTHER PUBLICATIONS 20290001.5, Examination Report, dated Aug. 18, 2021, 8 pages.
20290001.5, Extended European Search Report, dated Jul. 3, 2020, 11 pages.

*Primary Examiner* — Quan Tra
(74) *Attorney, Agent, or Firm* — Stoel Rives LLP

(57) ABSTRACT

A signal processor and method. The signal processor includes a signal current path. The signal processor includes a transconductor. The transconductor has an input operable to receive an input voltage of the signal processor. The transconductor also has an output operable to output a current based on the input voltage. The signal processor also includes a processing stage coupled to the output of the transconductor to receive and process the current outputted by the transconductor. The signal processor further includes a current replicator operable to generate a replica current proportional to the current outputted by the transconductor. The signal processor also includes a comparator operable to compare an output of the current replicator with a reference. The signal processor further includes a current limiter operable to limit the current outputted by the transconductor based on the comparison of the output of the current replicator with the reference.

16 Claims, 2 Drawing Sheets

(56) References Cited

U.S. PATENT DOCUMENTS

2017/0322574 A1 11/2017 Jain et al.
2018/0062596 A1* 3/2018 Chan .................... H03G 1/0088

* cited by examiner

SIGNAL PROCESSOR AND METHOD

BACKGROUND

The present specification relates to a signal processor and to a method of limiting a current provided to a processing stage of a signal processor.

For various circuits such as Delta-Sigma converters or voltage regulators, there is a need to perform a signal integration as part of the filtering function or feedback transfer function (e.g. proportional-integral-derivative PID). A common signal integration method is to integrate a current using a capacitor. In this approach, a voltage input signal is first converted into a current by means of a transconductance circuit. The generated current charges or discharges a capacitor C. The resulting voltage across the capacitor C represents the integration of the current over time ($V\_capacitor=1/C*\int(I\_capacitor(t)*dt)$). The integrator can operate in a single or differential mode. For a circuit such as a Delta-Sigma converter, there is a need to limit the current that is supplied to the integrator to avoid instability. High speed operation often requires the use of a small integration capacitor. Such a circuit is sensitive to additional parasitic capacitance which could hamper the circuit performance.

U.S. Pat. No. 7,719,339 describes the limitation of a signal voltage to a predetermined maximum voltage. An input signal is applied to a voltage divider which includes a variable-resistance component whose resistance is controlled by a control signal. An output signal is picked-up at the variable-resistance component. The control signal is generated as an amplified difference between the output signal and a fixed reference voltage, so that for an "overvoltage case" in which the value of the input signal exceeds that of a predetermined maximum voltage the output signal is kept substantially constant.

U.S. Pat. No. 9,372,495 describes a dB-linear voltage-to-current converter. The dB-linear V/I converter has a voltage scaler, a current multiplier, and an exponential current converter serially connected to one another. The voltage scaler supplies an input current to the current multiplier based on an input voltage. The current multiplier multiplies the input current and a current proportional to absolute temperature and supplies the resulting current to the exponential current converter. The exponential current converter has a differential MOSFET pair operating in a sub-threshold mode and generating an output current that is proportional to a temperature-independent, exponential function of the input voltage.

U.S. Pat. No. 7,692,468 describes an active over-voltage clamp system that includes at least one over-voltage detector that is responsive to an input voltage and provides a first current. The system also includes a replica over-voltage circuit that provides a second current, and circuitry subtracting the second current from the first current to produce a difference current. The system further includes a differential clamp activated in response to the difference current. The differential clamp prevents the input voltage from increasing beyond a target voltage.

SUMMARY

Aspects of the present disclosure are set out in the accompanying independent and dependent claims. Combinations of features from the dependent claims may be combined with features of the independent claims as appropriate and not merely as explicitly set out in the claims.

According to an aspect of the present disclosure, there is provided a signal processor comprising:
a signal current path;
a transconductor comprising:
an input operable to receive an input voltage of the signal processor; and
an output operable to output a current based on the input voltage;
a processing stage coupled to the output of the transconductor to receive and process the current outputted by the transconductor;
a current replicator operable to generate a replica current proportional to the current outputted by the transconductor;
a comparator operable to compare an output of the current replicator with a reference; and
a current limiter operable to limit the current outputted by the transconductor based on the comparison of the output of the current replicator with the reference.

According to another aspect of the present disclosure, there is provided a method of limiting a current provided to a processing stage of a signal processor, the method comprising:
receiving an input voltage and generating an output current through a signal current path;
the processing stage receiving and processing said output current;
a current replicator generating a replica current proportional to the current outputted to the processing stage;
comparing an output of the current replicator with a reference;
determining whether to limit the current outputted to the processing stage in response to the comparison of the output of the current replicator with the reference; and
using a current limiter to limit current outputted to the processing stage.

A signal processor and method according to embodiments of this disclosure may allow overload of the processing stage of the signal processor, associated with too high a current being passed to the processing stage, to be prevented. Moreover, according to embodiments of this disclosure, the signal processor and method can make a determination on whether current limiting is required without interfering with the normal operation of the transconductor or the processing stage (as used herein, the term "normal operation" refers to the operation of the signal processor when the current outputted by the transconductor is not being limited).

The current replicator may be connected to the transconductor at an intermediate node that is separate from the signal current path. The current limiter may also be connected to the transconductor at an intermediate node that is separate from the signal current path. These features can accordingly allow the components of the signal processor that are used to determine whether current limiting is required, and the current limiting operation itself, to perform their tasks without interfering with the actual current outputted to the processing stage by the transconductor. In particular, embodiments of this disclosure can avoid adding parasitic capacitance onto the signal path whilst ensuring an accurate and fast current limiting operation.

The signal processor may include a current limiter for limiting the current outputted by the transconductor.

The current limiter may have a variable impedance for limiting the current outputted by the transconductor. The current limiter may be operable to adjust a conversion gain of the transconductor by varying the impedance of the variable impedance. The conversion gain of the transconductor may generally be defined by the proportionality constant by which the input voltage is converted to the output current.

An output of the comparator may be coupled to the current limiter. The current limiter may be operable to adjust its impedance based on the output of the comparator. In this way, the output of the comparator can be used directly to control the operation of the current limiter, without necessarily requiring a separate controller. This can reduce the complexity of the signal processor and reduce manufacturing costs.

The signal processor may further include a controller operable to determine whether to limit the current outputted by the transconductor based on the comparison of the output of the current replicator with the reference and to control the current limiter to limit the current. The use of a controller can improve the flexibility with which the operation of the current limiter can be controlled (in contrast to the hard-wired approach noted above, in which the operation of the current limiter is determined directly by the output of the comparator).

The output of the transconductor may be a differential output operable to output a differential current.

In such embodiments, the signal processor may comprise a further current replicator and a further comparator. The current replicator may be operable to generate the replica current proportional to the differential current outputted by the transconductor. The further current replicator may be operable to generate a further replica current proportional to the differential current outputted by the transconductor. The comparator may be operable to compare the output of the current replicator with a first reference. The further comparator may be operable to compare the output of the further current replicator with a second reference. The signal processor may be operable to limit the differential current outputted by the transconductor based on the comparison of the output of the current replicator with the first reference. The signal processor may also be operable to limit the differential current outputted by the transconductor based on the comparison of the output of the further current replicator with the second reference.

The first reference may correspond to an upper (e.g. positive) current threshold and the second reference may correspond to a lower (e.g. negative) current threshold (or vice versa). Accordingly, in such embodiments, the differential current can be limited to between upper (e.g. positive) and lower (e.g. negative) current thresholds or boundaries.

When the transconductor has a differential output as noted above, the current limiter may have a variable impedance for limiting the current outputted at each terminal of the differential output of the transconductor.

The or each reference may be a reference current for direct comparison with a respective replica current.

The or each current replicator may be operable to output a voltage proportional to the replica current generated by that current replicator. In such embodiments, the or each reference may be a reference voltage.

The or each reference may be representative of a threshold (e.g. maximum or minimum) current to be outputted by the transconductor.

The signal processor may include, or be, one of a filter and an analogue to digital converter (ADC). The analogue to digital converter may be a Delta Sigma analogue to digital converter ($\Delta\Sigma$ ADC).

BRIEF DESCRIPTION OF THE DRAWINGS

Embodiments of this disclosure will be described hereinafter, by way of example only, with reference to the accompanying drawings in which like reference signs relate to like elements and in which.

DETAILED DESCRIPTION

Embodiments of this disclosure are described in the following with reference to the accompanying drawings.

Figure 1:
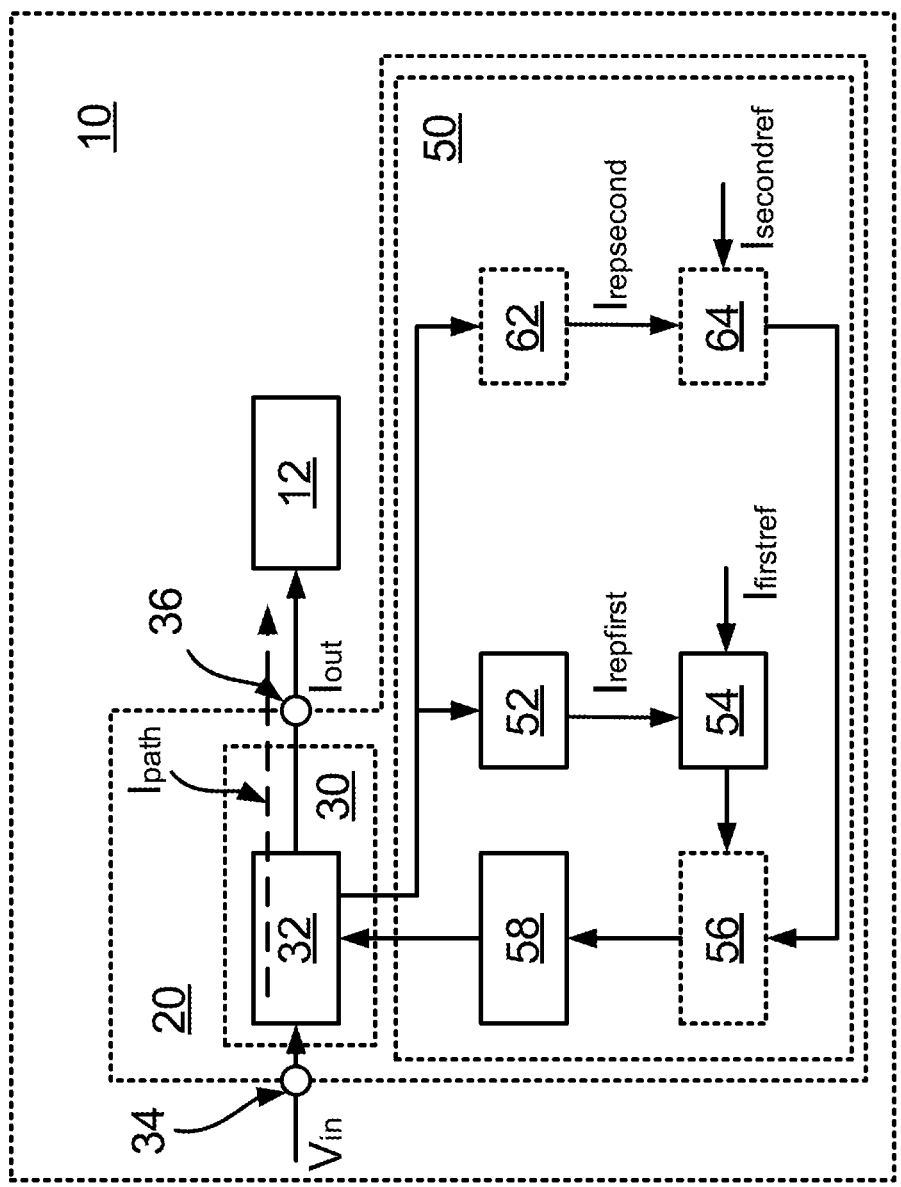
FIG. 1 shows a signal processing circuit according to an embodiment of this disclosure.

FIG. 1 shows a signal processing circuit 10 according to an embodiment of this disclosure. The signal processing circuit 10 may be incorporated into a signal processor. The signal processor may, for instance, comprise a filter or an analogue to digital converter (ADC). In particular, the analogue to digital converter may in some embodiments be a Delta Sigma analogue to digital converter ($\Delta\Sigma$ ADC).

The signal processing circuit 10 in this embodiment comprises a voltage to current converter 20. The voltage to current converter 20 includes a transconductor 30 and a current limiting circuit 50. The transconductor 30 includes an input 34 for receiving an input voltage ($V_{in}$) of the signal processing circuit 10. The input 34 may be a single ended input (comprising a single terminal) or alternatively a differential input (e.g. having two output terminals). The transconductor 30 is operable to convert the input voltage $V_{in}$ into a current ($I_{out}$). The transconductor 30 may include circuitry 32 for performing this conversion. The transconductor 30 also includes an output 36 for outputting the current $I_{out}$. The current signal path taken by the current $I_{out}$ is represented in FIG. 1 by the dashed arrow labelled $I_{path}$. It is envisaged that the output 36 may be single-ended output (comprising a single output terminal). It is also envisaged that the output 36 may be differential output (e.g. having two output terminals). As described herein, embodiments of this disclosure may be applied to either kind of input 34 and output 36.

The signal processing circuit 10 also includes a processing stage 12. The processing stage 12 is coupled to the output 36 of the transconductor 30 for receiving the current $I_{out}$ outputted by the transconductor 30. The processing stage 12 may accordingly process a signal received by the signal processing circuit 10 following its conversion into a current by the transconductor 30. The processing stage 12 may, for instance, comprise an amplifier or integrator.

In one embodiment, in which the signal processing circuit 10 is incorporated into a signal processor such as a Delta Sigma analogue to digital converter ($\Delta\Sigma$ ADC), the processing stage 12 may perform the above mentioned signal integration function as part of a filtering function or feedback transfer function, and may integrate $I_{out}$ using a capacitor as also mentioned above.

As described herein, in a conventional Delta-Sigma converter, there would be a risk that overload of a processing stage such processing stage 12 may be caused by high currents being outputted by the transconductor 30. This overloading can lead to instability in the signal processing circuit 10, which may lead to, for example, erroneous processing of the current $I_{out}$ by the processing stage 12.

To address this problem, according to embodiments of this disclosure, the signal processing circuit 10 is operable to limit the current $I_{out}$ outputted by the transconductor 30. In this way, $I_{out}$ may be kept to within levels that do not cause overloading and the associated instability or distortion in the operation of the processing stage 12. Moreover, according to embodiments of this disclosure, this limiting of $I_{out}$ may be implemented in a manner that does not affect or interfere with the operation of the transconductor 30 or the processing stage 12. That is to say, the operation of the current limiting function described herein need not itself lead to any parasitic capacitance being added onto the current signal path.

In the present embodiment, to implement the current limiting functionality of the signal processing circuit 10, the voltage to current converter 20 includes one or more current replicators 52, 62 and one or more comparators 54, 64. As shown in FIG. 1, the current replicators 52, 62 and the comparators 54, 64 may be provided as part of the current limiting circuit 50 of the voltage to current converter 20.

In embodiments in which the output 36 of the transconductor 30 is a single ended output, the current replicator 52 may replicate this output and the current replicator 62 and comparator 64 need not be present. On the other hand, where the output 36 of the transconductor 30 is a differential output operable to output a differential current, each current replicator 52, 62 may replicate the differential current at the differential output. As discussed below, this can allow the differential current to be kept with upper (e.g. positive) and lower (e.g. negative) threshold current values.

Each current replicator 52, 62 is operable to generate a replica current proportional to the current outputted by the transconductor 30. Note that each replica current need not be equal to the output current that it replicates, but may scale with the output current (e.g. by a constant proportionality factor $\alpha$).

Each comparator 54, 64 may be coupled to an output of a respective one of the current replicators 52, 62. In the present embodiment, comparator 54 is coupled to an output of the current replicator 52 and the comparator 64 is coupled to an output of the current replicator 62. Each comparator 54, 64 is operable to compare the output of the current replicator 52, 62 to which it is coupled with a reference.

In some embodiments, the output of each current replicator 52, 62 may be a current. For instance, in FIG. 1, the output of the current replicator 52 is $I_{repfirst}$ and the output of the current replicator 62 is $I_{repsecond}$. As noted above, the replica currents may be directly proportional to the currents that they replicate (e.g. $I_{repfirst} = \alpha \cdot I_{out}$ and/or $I_{repsecond} = \beta \cdot I_{out}$, where $\alpha$ and $\beta$ are constants, which may, but need not be, equal to each other).

The output current of each current replicator 52, 62 may, for instance be the replica current generated by that current replicator 52, 62. In such embodiments, the reference to which the output of each current replicator 52, 62 is compared by each comparator 54, 64 may be a reference current. For instance, in FIG. 1, the output of the current replicator 52 is $I_{repfirst}$ and the output of the current replicator 62 is $I_{repsecond}$, and the references used by the comparators 54, 64 are $I_{firstref}$ and $I_{secondref}$ respectively.

In other embodiments, each current replicator 52, 62 may be operable to output a voltage ($V_{repfirst}$, $V_{repsecond}$) that is proportional to the replica current generated by that current replicator 52, 62. In such embodiments, each reference may be a reference voltage ($V_{firstref}$, $V_{secondref}$).

The results of the comparison performed by each comparator 54, 64 are used by the signal processing circuit 10 to determine whether the current at the output 36 of the transconductor 30 requires limiting in order to avoid overloading of the processing stage 12. It will be appreciated that the reference used by each comparator 54, 64 may be set using knowledge of the operating parameters of the signal processing circuit 10 and of the processing stage 12 itself. For instance, each reference may represent a threshold value of $I_{out}$ (e.g. maximum current $I_{out\_max}$) beyond which overloading in the processing stage 12 may occur (e.g. $I_{out\_max} = I_{firstref}/\alpha$ and/or $I_{out\_max} = I_{secondref}/\beta$). In such embodiments, action may be taken to limit $I_{out}$ when the comparison performed by each comparator 54, 64 indicates that the threshold (e.g. maximum output current $I_{out\_max}$) has been breached. The current limiting function may continue until the comparison performed by each comparator 54, 64 indicates that $I_{out}$ has returned to acceptable levels. Accordingly, the signal processing circuit 10 is operable to limit the current $I_{out}$ outputted by the transconductor 30 based on the comparison of the output of the current replicator(s) 52, 62 with reference current(s)/voltage(s).

In some embodiments, in order to implement the limiting of the output current $I_{out}$ when the above discussed comparison of $I_{out}$ with the reference of each comparator 54, 64 shows that limiting of $I_{out}$ is required, the current limiting circuit 50 may further include a current limiter 58. The current limiter 58 may in some embodiments be provided as part of the transconductor 30, however in the present embodiment the current limiter 58 is provided in separate circuitry which is connected to the circuitry 32 of the transconductor 30 that performs the voltage to current conversion (this is shown schematically in FIG. 1).

In some embodiments, the current limiter 58 may be coupled directly to each comparator 54, 64 to receive and implement the results of the comparison performed by each comparator 54, 64. In other embodiments, a current limit controller 56 provided. The current limit controller 56 may be coupled to each comparator 54, 64 and to the current limiter 58. The current limit controller 56 may receive and process the results of the comparison performed by each comparator 54, 64 and send appropriate control signals to the current limiter 58 for implementing the limitation of the output current $I_{out}$. The current limit controller 56 may, for instance, comprise an amplifier, a filter or a level-shifter to implement this functionality.

In some embodiments, the current limiter 58 has a variable impedance (e.g. a transistor having an impedance controlled by a gate potential), which may be used to adjust the conversion gain of the transconductor 30. By adjusting the impedance of the variable impedance (e.g. by modulating the gate potential of the aforementioned transistor), the value of $I_{out}$ may thus be limited to acceptable values (e.g. beneath the maximum current threshold noted above). It is envisaged that this approach to limiting the current $I_{out}$ may be applied to transconductors 30 that have either a single ended output or a differential output.

As will be described in more detail below in relation to FIG. 2, the current limiter 58 and/or each current replicator 52, 62 may be connected to the transconductor 30 at an intermediate node (or nodes) of the transconductor 30 that is/are separate from the current signal path taken by the current $I_{out}$ (represented in FIG. 1 by the dashed arrow labelled $I_{path}$). Accordingly, the current limiter 58 and/or each current replicator 52, 62 (and each comparator 54, 64) may be separated from the output 36 of the transconductor 30. In this way, the operation of the current limiter 58 and/or each current replicator 52, 62, each comparator 54, 64, and any other circuitry located downstream of the comparators 54, 64 need not interfere with the normal operation of the transconductor 30 or the processing stage 12 (in particular, no parasitic capacitance is added to the signal path). Moreover, the current replicators 52, 62 can allow the comparators 54, 64 to operate by using the outputs of the current replicators 52, 62, whereby the comparators 54, 64 are not required to directly sample or manipulate the output current $I_{out}$ itself.

Figure 2:
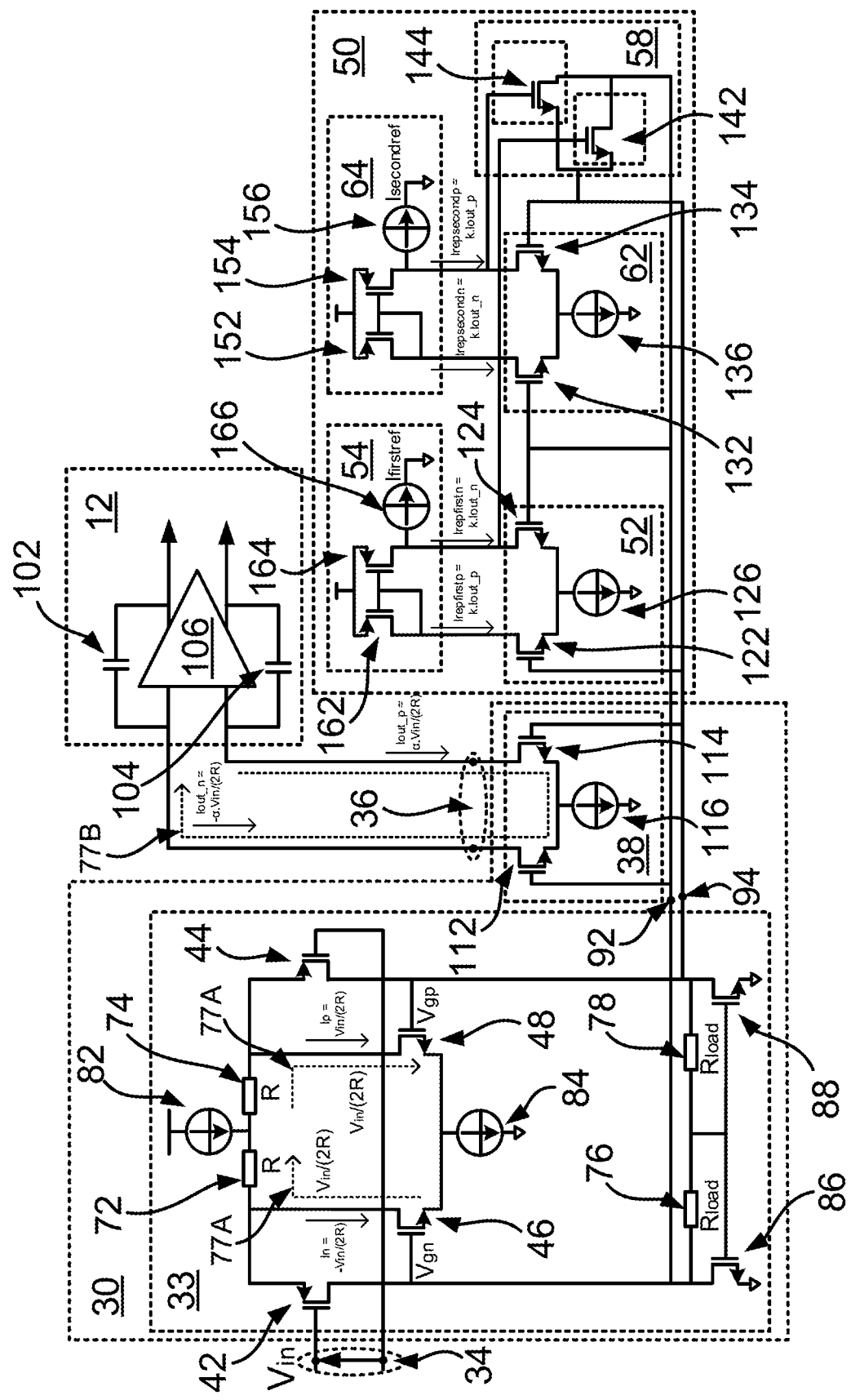
FIG. 2 shows a detailed circuit diagram of a signal processing circuit according to an embodiment of this disclosure.

FIG. 2 shows a detailed circuit diagram of a signal processing circuit 10 according to an embodiment of this disclosure.

As described above in relation to FIG. 1, the signal processing circuit 10 of FIG. 2 includes a transconductor 30, a processing stage 12, and a current limiting circuit 50 that includes current replicators 52, 62, comparators 54, 64 and a current limiter 58.

In this embodiment, the processing stage 12 comprises a differential amplifier 106 and capacitors 102, 104. The inputs of the differential amplifier 106 are coupled to the terminals of the output 36 of the transconductor thereby to receive the output current $I_{out}$. A first terminal of each capacitor 102, 104 is coupled to a respective one of the terminals of the output 36 of the transconductor, and a second terminal of each capacitor 102, 104 is coupled to a respective output of the differential amplifier 106.

In the embodiment of FIG. 2, the input 34 of the transconductor 30 is a differential input and the output 36 of the transconductor 30 is a differential output. However, it will be appreciated that the principle of operation of a signal processing circuit of the kind described herein may also be applied to signal processing circuits having a transconductor with a single ended input and a single ended output, as well as to signal processing circuits having a transconductor with a single ended input and a differential output, or indeed with a differential input and a single ended output.

In this embodiment, the outputs of the comparators 54, 56 are coupled directly to the current limiter 58 and no separate current limit controller 56 of the kind described in relation to FIG. 1 is provided (nevertheless, it is envisaged that the embodiment of FIG. 2 could be modified to include such a controller). In particular, the output of the comparator 54 drives a controllable impedance 142 and the output of the comparator 64 drives a controllable impedance 144 in the current limiter 58. The controllable impedances 142, 144 may be implemented by transistors (NMOS transistors are shown in FIG. 2, but it is envisaged that PMOS transistors could also be used) having their control terminals coupled to the outputs of the comparators 54, 64. The controllable impedance 142 may be increased or decreased according to the output of the comparator 54 so as to limit the negative swing of the differential output current $I_{out}$ at output 36, whereas the controllable impedance 144 may be increased or decreased according to the output of the comparator 64 so as to limit the positive swing of the differential output current $I_{out}$ at output 36 (where $I_{out}=I_{out\_p}-I_{out\_n}$).

The transconductor 30 is operable to convert the differential input voltage $V_{in}$ at input 34 into a differential output current $I_{out}=I_{out\_p}-I_{out\_n}$ at output 36 with a conversion factor α/R. The conversion of $V_{in}$ to $I_{out}$ is performed in two steps. In the first step, the input voltage $V_{in}$ is converted by the circuitry 33 into a differential conversion current $I=I_p-I_n=V_{in}/R$. In the second step, the conversion current I is then copied by transistors 112, 114 of output circuitry 38 to generate the differential output current $I_{out}$.

In this embodiment, the signal current path $I_{path}$ comprises two signal current path parts 77A, 77B. The signal current path parts 77A, 77B are separate from each other, but carry currents that are related to each other. In this embodiment, the signal current path $I_{path}$ comprises only the signal paths carrying currents proportional to the output current and necessary for the generation of the output current in normal operation. Accordingly, the signal current path $I_{path}$, does not comprise, for instance the signal paths conducting the replica currents used for current limitation purposes.

The first signal current path part 77A comprises signal lines that are connected to the source and drain of transistors 46 and 48 and both the terminals of resistors 72, 74 (each having resistance R) of the transconductor 30. The first signal current path part 77A conveys the differential conversion current I generated by the transconductor 30.

The second signal current path part 77B comprises signal lines that conduct the differential output current $I_{out}$, which is a proportional copy of the differential conversion current I.

In this embodiment, the current replicator 52 comprises a transistor 122 and a transistor 124. The sources of the transistors 122, 124 are coupled together and to a current source 126. The drains of the transistors 122, 124 form the outputs of the current replicator 52. Similarly, in this embodiment, the current replicator 62 comprises a transistor 132 and a transistor 134. The sources of the transistors 132, 134 are coupled together and to a current source 136. The drains of the transistors 132, 134 form the outputs of the current replicator 62.

The inputs of the current replicators 52, 62 in this embodiment are connected to two intermediate nodes 92, 94 of the transconductor 30 that are separate from the signal current path $I_{path}$. The inputs of the current replicators 52, 62 in this embodiment are formed by the gates of the transistors 122, 124 (current replicator 52) and the gates of the transistors 132, 134 (current replicator 62). In particular, the gates of the transistors 124 and 132 are connected to the intermediate node 92 and the gates of the transistors 122 and 134 are connected to the intermediate node 94. Accordingly, each current replicator 52, 62 in this embodiment has two inputs, each of which is connected to one of the intermediate nodes 92, 94 of the transconductor 30. Note that intermediate node 92 is connected to the gate of the transistor 42 (and is therefore at $V_{gn}$) and that intermediate node 94 is connected to the gate of the transistor 44 (and is therefore at $V_{gp}$). The intermediate nodes 92, 94 are each located between the circuitry 33, which converts the input voltage $V_{in}$ into the differential conversion current I, and the output circuitry 38, which copies the differential conversion current I to generate the differential output current $I_{out}$.

The current replicators 52, 62 in this embodiment each generate a respective replica current. Each replica current is an image of differential output current $I_{out}$, with a replica factor k. Because the intermediate nodes 92, 94 are separate from the signal current path $I_{path}$, the current replicators 52, 62 do not hamper the speed of the voltage-to-current conversion operation. Furthermore, the parasitic capacitance added by the current replicators 52, 62 is not coupled to the capacitors 102, 104 of the processing stage 12 and thus do not degrade the performance of the processing stage 12.

In this embodiment, the comparator 54 comprises a transistor 162 and a transistor 164. The sources of the transistors 162, 164 are coupled together and to a positive supply. The gates of the transistors 162, 164 are coupled together and to the drain of the transistor 162. A first reference current $I_{firstref}$ may be generated in the comparator 54 by a current source 166. The current source 166 may be connected to drain of the transistor 164. The input of the comparator 54 comprises the drain of the transistor 162, and is coupled to an output (in particular, the drain of the transistor 122) of the current replicator 52. The output of the comparator 54 comprises the drain of the transistor 164.

Similarly, in this embodiment, the comparator 64 comprises a transistor 152 and a transistor 154. The sources of the transistors 152, 154 are coupled together and to ground. The gates of the transistors 152, 154 are coupled together and to the drain of the transistor 152. A second reference current $I_{secondref}$ may be generated in the comparator 64 by a current source 156. The current source 156 may be connected to drain of the transistor 154. The input of the comparator 64 comprises the drain of the transistor 152, and is coupled to an output (in particular, the drain of the transistor 132) of the current replicator 62. The output of the comparator 54 comprises the drain of the transistor 154.

The inputs of the comparators 54, 64 are coupled to the drains of the transistors 122 and 132 of the current replicators 52 and 62, respectively. The outputs of the comparators 54, 64 are coupled to the drains of the transistors 124 and 134 of the current replicators 52 and 62, respectively. The outputs of the comparators 54, 64 are also coupled to the current limiter 58. In particular, the output of comparator 54 is coupled to the gate of transistor 142 while the output of comparator 56 is coupled to the gate of transistor 144.

The outputs of the current limiter 58 comprise:

a first output comprising the drains of transistors 142, 144, which are both connected to intermediate node 92 ($V_{gn}$); and a second output comprising the sources of transistors 142, 144, which are both connected to intermediate node 94 ($V_{gp}$).

If the first replica current $I_{repfirst}$ (=$I_{repfirstp}$−$I_{repfirstm}$) exceeds the first reference current $I_{firstref}$ generated by the current source 166 (i.e. if $k·(I_{out\_p}−I_{out\_n})>I_{firstref}$), then the output of the comparator 54 increases the gate voltage of the controllable impedance 142 to reduce the differential voltage ($V_{gp}−V_{gn}$) and thus limits the output current $I_{out}$ to $I_{firstref}/k$. Similarly, if the second replica current $I_{repsecond}$ is below the second reference current $I_{secondref}$ generated by the current source 156, then the output of the comparator 64 increases the gate voltage of the controllable impedance 144 to limit the output current $I_{out}$ to $I_{secondref}/k$.

As noted above, the transconductor 30 comprises (e.g. p-channel) transistors 42, 44, which form a classical voltage buffer. The gate of the transistor 42 is coupled to one terminal of the differential input 34 and the gate of the transistor 44 is coupled to another terminal of the differential input 34. The sources of the transistors 42, 44 are coupled together via the two series connected resistors 72, 74 (each having resistance R). A current source 82 is coupled to a node located between the two series connected resistors 72, 74.

The transconductor 30 also comprises a first differential transistor pair formed by (e.g. n-channel) transistors 46, 48. The gate of the transistor 46 is coupled to the drain of the transistor 42 and to the intermediate node 92. The gate of the transistor 48 is coupled to the drain of the transistor 44 and to the intermediate node 94. The sources of the transistors 46, 48 are coupled together and to a current source 84. The drain of the transistor 46 is coupled to a node located between the source of the transistor 42 and the resistor 72. The drain of the transistor 48 is coupled to a node located between the source of the transistor 44 and the resistor 74.

The transistors 46, 48 are provided for diverting the differential conversion current I from the transistors 42, 44 to minimize conversion errors due to any gate-source voltage variation of the transistors 42 and 44. Indeed, the differential voltage across the resistors 72, 74 is $V_R=V_{in}−(\delta V_{gs\_transistor42}−\delta V_{gs\_transistor44})$, where $\delta V_{gs\_transistor42}$ is the gate-source voltage variation of transistor 42 and $\delta V_{gs\_transistor44}$ is the gate-source voltage variation of transistor 44 related to the current variation of transistor 42 and the transistor 44. The lower the gate-source voltage variations, the closer $V_R$ is to $V_{in}$ and the more accurate the voltage-to-current conversion is.

In response to a variation of yin, a conversion current is generated across the resistors 72 and 74. This conversion current flows into the transistors 46 and 42 on one side and the transistors 48 and 44 on the other side. The ratio of the part of the conversion current flowing through the transistors 42, 44 and the one through the transistors 46, 48 depends on the ratio between the differential impedance between nodes 92 and 94, which mainly consists of resistances ($R_{load}$) of the resistors 76, 78 in normal operation without the action of the current limiter, and the conductances (1/gm) of the transistors 46 and 48.

The transistors 86, 88 can provide a common mode path to ground for the transistors 42, 44 whereas the differential path is defined by the resistors 76 and 78. In this way, the common mode biasing current of the transistors 42 and 44 can flow to ground through the transistors 86, 88 without passing through the resistors 76 and 78. This construction can allow use of a high $R_{load}$ value, to maximize $R_{load}·gm$, without losing too much headroom at the drains of the transistors 42, 44 in comparison to a conventional construction with the resistor 76 connected between the drain of transistor 42 and ground on one side and resistor 78 between the drain of the transistor 44 and ground on the other side. In this embodiment, the voltage at the drain of the transistors 42, 44 may be equal to $V_{gs}$ of the transistor 86 (which may be the same as $V_{gs}$ of the transistor 88), which may be substantially lower than $R_{load}*I_{ds\_bias\_m}$, $I_{ds\_bias\_m}$ being the biasing current through the transistor 82, for the transistors 42 (likewise for transistor 44) for a high a $R_{load}$.

In practice, $R_{load}·gm$ may be set as high as possible such that the transistors 46, 48 conduct most of the conversion current, thereby minimizing the current flowing through the transistors 42 and 44 and thus minimizing $\delta V_{gs\_transistor42}$ and $\delta V_{gs\_transistor44}$.

Therefore, the voltage $V_R$ across the resistors 72 and 74 may be substantially equal to $V_{in}$ allowing an accurate voltage to current conversion, and the differential conversion current I to be substantially equal to $V_R/R$. With a high value of gm, the voltage variation at $V_{gn}$ and $V_{gp}$ may be made small in comparison to $V_{in}$.

As explained above, with $R_{load}·gm$ set to a high value, the differential conversion current I has a value close to $V_{in}/R$ and flows mainly through the transistors 46 and 48. A copy of the conversion current I is performed using a second differential transistor pair comprising the transistors 112 and 114 in the output circuitry 38. In the output circuitry 38, the sources of the transistors 112 and 114 are coupled together and to a current source 116. The drain of the transistor 112 is coupled to one of the output terminals (for $I_{out\_n}$) of the differential output 36 and the drain of the transistor 114 is coupled to the other of the output terminals (for $I_{out\_p}$) of the differential output 36 of the trans conductor 30. The gate of the transistor 112 is coupled to the intermediate node 92 (and thereby to the gate of the transistor 46), and the gate of the transistor 114 is coupled to the intermediate node 94 (and thereby to the gate of the transistor 48), forming a differential current mirror.

The second differential transistor pair comprising the transistors 112 and 114 accordingly generates the differential output current $I_{out}=I_{out\_p}−I_{out\_n}$, which is proportional to $V_{in}/R$ and which is supplied to the processing stage 12 through the second signal current path part 77B of the signal current path $I_{path}$.

To prevent a too high current $I_{out}$ going into the processing stage 12 in case of overvoltage of $V_{in}$, a copy of $I_{out}$ is generated by connecting the current replicators 52, 62, in which the transistors 122, 124 form a third differential transistor pair and the transistors 132, 134 form a fourth differential transistor pair.

The gate of the transistor 122 of the third differential transistor pair and the gate of the transistor 134 of the fourth differential transistor pair are each connected to the gate of the transistor 48 of the first differential transistor pair and the gate of the transistor 114 of the second differential transistor pair (by virtue of their connection to the intermediate node 94). Similarly, the gate of the transistor 124 of the third differential transistor pair and the gate of the transistor 132 of the fourth differential transistor pair are each connected to the gate of the transistor 46 of the first differential transistor pair and the gate of the transistor 112 of the second differential transistor pair (by virtue of their connection to the intermediate node 92).

Similarly to the transistors 112, 114 of the second differential transistor pair, the transistors 122, 124 of the third differential transistor pair and the transistors 132, 134 of the fourth differential transistor pair generate replica currents $I_{repfirst}=I_{repfirstp}-I_{repfirstn}$ and $I_{repsecond}=I_{repsecondp}-I_{repsecondn}$, which are proportional to $I_{out}$. A current mirror (formed in each of the comparators 54, 56) and a biasing current source (comprising the current sources 126, 136) are coupled to each of the transistor pairs 122, 124 and 132, 134. The drains of the transistors 124, 134 are also coupled to the gates of the transistors forming the controllable impedances 142, 144 in the current limiter 58 to control their impedances in response to the comparison of the replica currents $I_{repfirst}$ and $I_{repsecond}$ to the reference currents $I_{firstref}$ and $I_{secondref}$, respectively.

As explained previously, in conjunction with the comparators 54 and 64, the current replicator 52 allows limiting of the positive amplitude of $I_{out}$, while current replicator 62 allows limiting of the negative amplitude of $I_{out}$.

In particular, if the positive value of $I_{out}$ is such that $I_{repfirst}$ exceeds the reference current $I_{firstref}$, the gate voltage of the transistor forming the controllable impedance 142 increases, causing a reduction of the drain-source impedance of the transistor forming the controllable impedance 142. Because the controllable impedance 142 is placed in parallel with the intermediate nodes 92, 94, this reduced impedance reduces the voltage variation at those intermediate nodes 92, 94, which thus reduces the value of the differential conversion current I and in turn the differential output current $I_{out}$. This allows limiting of the output current $I_{out}$ despite a high input voltage $V_{in}$. A similar operation can be performed by the current replicator 62 and the controllable impedance 144, so as to limit the negative amplitude of the differential conversion current I and output current $I_{out}$. Accordingly, the reference currents in this embodiment may correspond to upper (e.g. positive) and lower (e.g. negative) current thresholds, and the differential current can be limited to between upper (e.g. positive) and lower (e.g. negative) current thresholds or boundaries.

As the inputs of the current replicators 52, 62, the comparators 54, 64 and the outputs of the current limiter 58 are separate from the signal current path $I_{path}$, the impact of the current limiting circuit 50 on the normal operation of the signal processing circuit 10 may be avoided or at least minimized. In particular, because features such as the current replicators 52, 62, the comparators 54, 64 and the outputs of the current limiter 58 are not directly connected to the signal current path $I_{path}$, the signal current path $I_{path}$ may not be loaded by parasitic elements (e.g. capacitance) from the components of these features. This can allow the operation speed of the transconductor 30 and the speed and accuracy of the signal processing circuit 10 as a whole to be preserved, notwithstanding the presence of the previously described functionality for limiting the differential output current $I_{out}$ for large values of yin. Moreover, the reaction time of the current limiting functionality described herein may be particularly fast, according to embodiments of this disclosure.

In the embodiments described above, it is envisaged that fully differential current replicators and comparators may be used instead of separate current replicators and comparators for positive and negative signal amplitude detection.

Accordingly, there has been described a signal processor and method. The signal processor includes a signal current path. The signal processor includes a transconductor. The transconductor has an input operable to receive an input voltage of the signal processor. The transconductor also has an output operable to output a current based on the input voltage. The signal processor also includes a processing stage coupled to the output of the transconductor to receive and process the current outputted by the transconductor. The signal processor further includes a current replicator operable to generate a replica current proportional to the current outputted by the transconductor. The signal processor also includes a comparator operable to compare an output of the current replicator with a reference. The signal processor further includes a current limiter operable to limit the current outputted by the transconductor based on the comparison of the output of the current replicator with the reference.

Although particular embodiments of this disclosure have been described, it will be appreciated that many modifications/additions and/or substitutions may be made within the scope of the claims.

The invention claimed is:

1. A signal processor comprising:
    a signal current path;
    an intermediate node that is separate from the signal current path;
    a transconductor comprising:
        an input operable to receive an input voltage of the signal processor; and
        an output operable to output, via the signal current path, a current based on the input voltage;
    a processing stage coupled to the output of the transconductor to receive and process the current outputted by the transconductor via the signal current path;
    a current replicator operable to generate a replica current proportional to the current outputted by the transconductor;
    a comparator operable to compare an output of the current replicator with a reference; and
    a current limiter operable to limit the current outputted by the transconductor based on the comparison of the output of the current replicator with the reference,
    wherein the current replicator and/or the current limiter are connected to the transconductor at the intermediate node,
    wherein the output of the transconductor is a differential output operable to output a differential current, wherein the signal processor comprises:
        a further current replicator; and
        a further comparator,
    wherein the current replicator is operable to generate said replica current proportional to the differential current outputted by the transconductor, wherein the further current replicator is operable to generate a further replica current proportional to the differential current outputted by the transconductor, wherein the comparator is operable to compare the output of the current replicator with a first reference, wherein the further comparator is operable to compare the output of the further current replicator with a second reference, and wherein the signal processor is operable to:
limit the differential current outputted by the transconductor based on the comparison of the output of the current replicator with the first reference; and
limit the differential current outputted by the transconductor based on the comparison of the output of the further current replicator with the second reference.

2. The signal processor of claim 1, wherein the current limiter has a variable impedance for limiting the current outputted by the transconductor.

3. The signal processor of claim 2, wherein the current limiter is operable to adjust a conversion gain of the transconductor by varying the impedance of said variable impedance.

4. The signal processor of claim 2, wherein an output of the comparator is coupled to the current limiter, and wherein the current limiter is operable to adjust its impedance based on the output of the comparator.

5. The signal processor of claim 2 further comprising a controller operable to:
determine whether to limit the current outputted by the transconductor based on the comparison of the output of the current replicator with the reference; and
control the current limiter to limit said current.

6. The signal processor of claim 1, wherein the current limiter has a variable impedance for limiting the current outputted at each terminal of the differential output of the transconductor.

7. The signal processor of claim 1, wherein the or each reference comprises a reference current for direct comparison with a respective said replica current or further replica current.

8. The signal processor of claim 1, wherein:
the or each current replicator is operable to output a voltage proportional to the replica current generated by that current replicator, and
the or each reference is a reference voltage.

9. The signal processor of claim 1, wherein the or each reference is representative of a threshold current to be outputted by the transconductor.

10. The signal processor of claim 1, comprising one of a filter and an analogue to digital converter (ADC).

11. The signal processor of claim 10, wherein the analogue to digital converter is a Delta Sigma analogue to digital converter ($\Delta\Sigma$ ADC).

12. A method of limiting a current provided to a processing stage of a signal processor, the method comprising:
a transconductor receiving an input voltage and generating an output current through a signal current path;
the processing stage receiving and processing said output current;
a current replicator generating a replica current proportional to the current outputted to the processing stage;
a comparator comparing an output of the current replicator with a reference;
determining whether to limit the current outputted to the processing stage in response to the comparison of the output of the current replicator with the reference; and
in response to determining to limit the current outputted to the processing stage, using a current limiter to limit current outputted to the processing stage,
wherein the current replicator and/or the current limiter are connected to an intermediate node that is separate from the signal current path,
wherein the output of the transconductor is a differential output operable to output a differential current, wherein the signal processor comprises:
a further current replicator; and
a further comparator,
the method comprising:
the current replicator generating said replica current proportional to the differential current outputted by the transconductor;
the further current replicator generating a further replica current proportional to the differential current outputted by the transconductor;
the comparator comparing the output of the current replicator with a first reference;
the further comparator comparing the output of the further current replicator with a second reference; and
the signal processor:
limiting the differential current outputted by the transconductor based on the comparison of the output of the current replicator with the first reference; and
limiting the differential current outputted by the transconductor based on the comparison of the output of the further current replicator with the second reference.

13. The method of claim 12, wherein the current limiter has a variable impedance, the method further comprising varying the variable impedance of the current limiter to limit the current outputted by the transconductor.

14. The method of claim 13, comprising adjusting a conversion gain of the transconductor by varying the impedance of said variable impedance of the current limiter.

15. The method of claim 13, wherein an output of the comparator is coupled to the current limiter, the method comprising the current limiter adjusting its impedance based on the output of the comparator.

16. The method of claim 12, wherein the current limiter has a variable impedance for limiting the current outputted at each terminal of the differential output of the transconductor.

* * * * *